United States Patent
Natsume

(10) Patent No.: US 7,793,906 B2
(45) Date of Patent: Sep. 14, 2010

(54) CLAMPING MECHANISM

(75) Inventor: Mitsuo Natsume, Toyohashi (JP)

(73) Assignee: Shinko Electric Co., Ltd., Tokyo (JP)

( * ) Notice: Subject to any disclaimer, the term of this patent is extended or adjusted under 35 U.S.C. 154(b) by 344 days.

(21) Appl. No.: 12/059,355

(22) Filed: Mar. 31, 2008

(65) Prior Publication Data

US 2009/0241302 A1    Oct. 1, 2009

(51) Int. Cl.
*A47G 1/10* (2006.01)
(52) U.S. Cl. .................... 248/316.1; 248/500
(58) Field of Classification Search ............ 248/316.1, 248/316.3, 316.4, 500, 510; 414/217, 805, 414/411
See application file for complete search history.

(56) References Cited

U.S. PATENT DOCUMENTS 6,676,356 B2 * 1/2004 Saeki et al. ................ 414/217
7,621,174 B2 * 11/2009 Takaku .................... 73/114.53
2009/0142164 A1 * 6/2009 Miyajima et al. ........... 414/217

FOREIGN PATENT DOCUMENTS

| JP | 2003-297903 | 10/2003 |
| JP | 2004-140011 | 5/2004 |
| JP | 2005-129706 | 5/2005 |
| JP | 200891597 | * 4/2008 |

* cited by examiner

*Primary Examiner*—Ramon O Ramirez
(74) *Attorney, Agent, or Firm*—Oblon, Spivak, McClelland, Maier & Neustadt, L.L.P.

(57) ABSTRACT

The carrier base 3 is movably installed at the upper part of the FOUP opener main body 50b, and the clamping base 4 is movably installed at the upper part of the carrier base 3. The clamp lever 5a is rotatably supported by the rotating shaft 5c at the upper part of the clamping base 4, and the clamping pawl 5b is formed on the clamp lever 5a. The carrier base 3 and the FOUP 2 integrally move. The clamping pawl 5b, which is accommodated into the clamping recess 2h, presses the clamped portion 2c from above to below, by which the FOUP 2 is fixed to the mounting base 51.

8 Claims, 9 Drawing Sheets

Docking direction
←

Undocking direction
→

Docking direction     Undocking direction

CLAMPING MECHANISM

BACKGROUND OF THE INVENTION

1. Field of the Invention

The present invention relates to a clamping mechanism for fixing a wafer-accommodating FOUP to a mounting base.

2. Description of Related Art

A FOUP (Front Open Unified Pod) is used for accommodating and conveying wafers for an electronic device or storing these in a clean room. Then, in order to communicatively connect the interior of the FOUP with the interior of a semiconductor manufacturing device, the FOUP is fixed to an interface mechanism, which is called a FOUP opener (or a load port). Furthermore, at the FOUP opener, the FOUP is docked to a port door, which shields a communication port leading to the semiconductor manufacturing device, by which the interior of the FOUP and the interior of the semiconductor manufacturing device are kept airtight and communicatively connected with each other, the interiors of the FOUP and the semiconductor manufacturing device are kept at a high degree of cleanliness, while the exteriors thereof are kept at a low degree of cleanliness, thus this makes it possible to reduce construction and operation costs of the clean room.

A FOUP opener is required to have measures for preventing the contamination of semiconductors by foreign fine particles. For this reason, a mounting base at which a FOUP is installed and fixed is moved from an undocking position to a docking position, by which the FOUP is kept airtight and docked to a port door. Then, in order to bring in and out wafers, a lid portion of the FOUP and the port door are opened or closed. Furthermore, in this instance, it is necessary to fix the FOUP on the mounting base of the FOUP opener by such a sufficient force to keep an airtight state between the FOUP and the semiconductor manufacturing device. Regarding the above-described fixture of the FOUP, the SEMI (Semiconductor Equipment and Materials International) standards specify that a FOUP clamping mechanism is installed on a FOUP opener. The standards also specify a configuration of recesses for a clamping mechanism on the bottom of the FOUP, a clamping force necessary for the clamping mechanism or the like. Then, as examples of the clamping mechanism according to these standards, known are technologies disclosed in (1) Japanese Published Unexamined Patent Application No. 2003-297903, (2) Japanese Published Unexamined Patent Application No. 2005-129706 and (3) Japanese Published Unexamined Patent Application No. 2004-140011. In the technologies of Patent Documents (1) and (2), a clamping pawl is hooked on the clamping recess at the bottom of the FOUP and also the pawl is lowered, by which the pawl is pressed to the mounting base of the FOUP opener to fix the FOUP.

Furthermore, Patent Document (3) discloses a FOUP opener capable of adjusting a direction at which a FOUP is installed. In the FOUP opener, a notch is formed at a mounting base (a connecting plate and a container mounting piece) and a cylindrical portion, which is able to rotate, ascend and descend, is arranged into the notch. A mounting plate, on which the FOUP is mounted, is provided at the upper end of the cylindrical portion. Then, a motor for actuating the cylindrical portion is provided inside a supporting piece installed below the mounting base. Since this prior art is constituted as described above, eliminated is a necessity for providing a large device (a FOUP handling hand), thus this makes it possible to adjust a FOUP installing direction and position correctly a drawing port of the FOUP with respect to a semiconductor manufacturing device.

SUMMARY OF THE INVENTION

In a clean room at which a FOUP opener is installed, available space is valued and better as it is wider as much as possible, thereby it is desirable to use a space below a mounting base effectively. The clamping mechanisms disclosed in Patent Documents (1) and (2) are constituted so as to include an actuator such as an air cylinder or a motor for actuating a clamping pawl. Then, the above-described actuator is installed at a space below a mounting base for fixing the FOUP. Therefore, the space below the mounting base is occupied by the actuator or the like and cannot be effectively used.

Furthermore, as described above, the clamping mechanisms of Patent Documents (1) and (2) are those occupying a space below a mounting base, therefore, this makes it impossible to install the cylindrical portion and the motor below the mounting base. Therefore, they are not applicable to the technology described in Patent Document (3).

Still furthermore, where a FOUP is docked to a port door while using the clamping mechanisms of Patent Documents (1) and (2), it is necessary to conduct a two-stage operation of (1) clamping operation and (2) docking operation after the FOUP is installed on the mounting base and also to provide a cycle time for covering this two-stage operation.

Therefore, an object of the present invention is to provide a clamping mechanism capable of effectively using a space below a mounting base.

Another object of the present invention is to provide a clamping mechanism in which clamping is performed during the docking operation to shorten a cycle time.

In order to attain the above objects, the clamping mechanism of the present invention is a clamping mechanism for fixing a FOUP to a mounting base used in a FOUP opener in which the FOUP capable of accommodating wafers is fixed to the mounting base, the FOUP fixed to the mounting base is docked to a port door, which opens and closes a communication port leading into a substrate processing device, thereby the interior of the FOUP and the interior of the substrate processing device are kept airtight and communicatively connected with each other. Then, the clamping mechanism is provided with a plate-like first mounting base movably installed at the upper part of a FOUP opener main body both in a docking direction at which the docking is conducted and in an undocking direction which is reverse to the docking direction, a plate-like second mounting base movably installed at the upper part of the first mounting base both in the docking direction and the undocking direction, a clamp lever rotatably supported by a rotating shaft extending in a horizontal direction and orthogonal to the docking direction and the undocking direction at the upper part of the second mounting base, a first member acting so as to move the second mounting base to the undocking direction with respect to the first mounting base and a second member. A clamping pawl projecting in the undocking direction is formed on the clamp lever, and the second member acts on the clamp lever so as to displace the clamping pawl downward. Since a positioning recess is formed on the bottom of the FOUP, and a positioning projection fitted into the positioning recess is formed on the first mounting base, the positioning projection is fitted into the positioning recess, by which the first mounting base and the FOUP are in a state that these can integrally move. Then, to fix the FOUP to the mounting base, the clamping pawl is accommodated into a clamping recess formed on the bottom of the FOUP, the second mounting base moves in the undocking direction with respect to the first mounting base, and the clamping pawl presses from above to below a clamped portion formed in a projected manner from an inner wall face of the clamping recess in the undocking direction side to the docking direction.

According to the above constitution, since the FOUP can be clamped without installing an actuator such as an air cylinder or a motor below the mounting bases (a first mounting base and a second mounting base), no space below the mounting bases is occupied. Therefore, it is possible to effectively use a space below the mounting bases. Furthermore, clamping is conducted during docking operation, thus this makes it possible to provide a clamping mechanism short in cycle time.

Furthermore, in the clamping mechanism of the present invention, the first member may be an elastic member connecting the second mounting base with the first mounting base. It is, thereby, possible to make the first member simple in constitution. In this instance, the elastic member is a member, which is flexible and also highly elastic, and includes, for example, a metal spring (a coil spring or the like), a resin spring and rubber.

The clamping mechanism of the present invention may also be provided with a stopper fixed to the FOUP opener main body and preventing the second mounting base from moving in the undocking direction. It is, thereby, possible to arrange a clamping pawl at a position at which the clamping pawl can be reliably accommodated into a clamping recess when a FOUP is lowered for setting.

Furthermore, the clamping mechanism of the present invention may additionally have a first contact portion installed on the first mounting base and a second contact portion installed on the second mounting base and arranged in the docking direction side with respect to the first contact portion, and when the first mounting base and the FOUP move in the docking direction, the first contact portion presses the second contact portion, thereby the first mounting base, the FOUP and the second mounting base may integrally move. According to this clamping mechanism, when the first mounting base, the FOUP and the second mounting base integrally move, the first contact portion presses the second contact portion, by which the second mounting base moves stably. There are also decreased loads on a clamp lever when the second mounting base moves.

Furthermore, in the clamping mechanism of the present invention, the second member may be an elastic member installed at the upper part of the second mounting base, in which a projection projecting in the docking direction is formed on the clamp lever, and the second member may be held between the projection and the second mounting base, and press the projection from below to above. It is, thereby, possible to make the second member simple in constitution. In this instance, the elastic member is a member, which is flexible and also highly elastic, and includes, for example, a metal spring (a coil spring or the like), a resin spring and rubber.

Furthermore, in the clamping mechanism of the present invention, a regulating portion for regulating an upward displacement amount of the projection may be formed on the second mounting base. In the thus constituted clamping mechanism, since the clamp lever is regulated for inclination, a clamping pawl is allowed to ride over a clamped portion even when a clamping force is increased.

Still furthermore, the clamping mechanism of the present invention may also be provided with a roller rotatably supported by a rotating shaft extending in a horizontal direction and also orthogonal to the docking direction and the undocking direction, in which the roller is installed at the leading end of the clamping pawl. In the thus constituted clamping mechanism, a clamping pawl is allowed to easily ride over a clamped portion when a FOUP is clamped, thereby easy clamping is provided.

In addition, in the clamping mechanism of the present invention, the second mounting base may be connected with the first mounting base via a linear motion guide arranged along the docking direction and the undocking direction. Accordingly, the second mounting base can be movably installed in the docking direction and the undocking direction with respect to the upper part of the first mounting base in a simple constitution.

Other and further objects, features and advantages of the invention will appear more fully from the following description taken in connection with the accompanying drawings in which.

DESCRIPTION OF THE PREFERRED EMBODIMENTS

Figure 1:
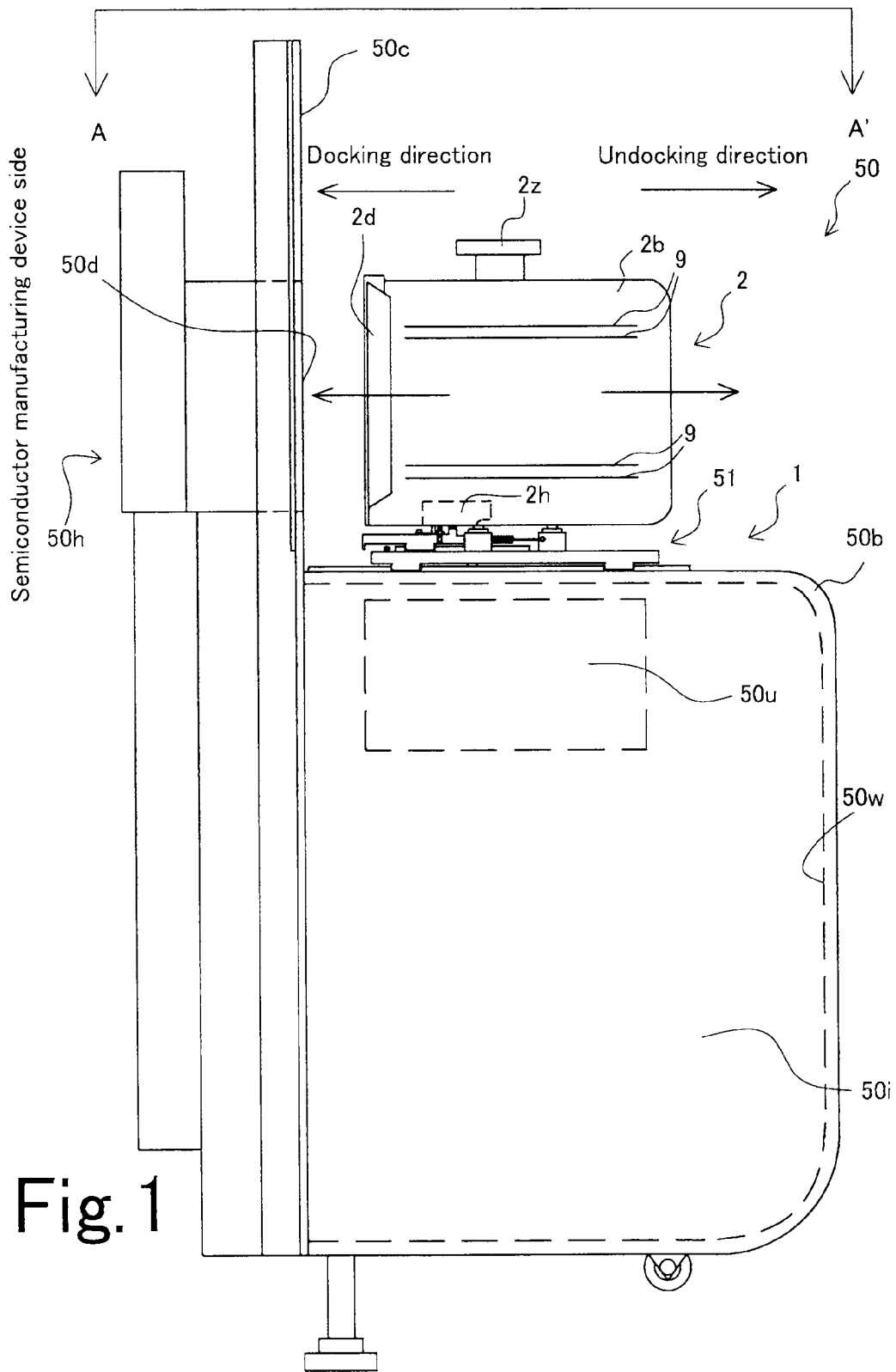
FIG. 1 is a side-face schematic diagram of a FOUP opener including a clamping mechanism of one embodiment of the present invention.

Hereinafter, a description will be made for a preferred embodiment of the present invention by referring to the drawings.

Figure 2:
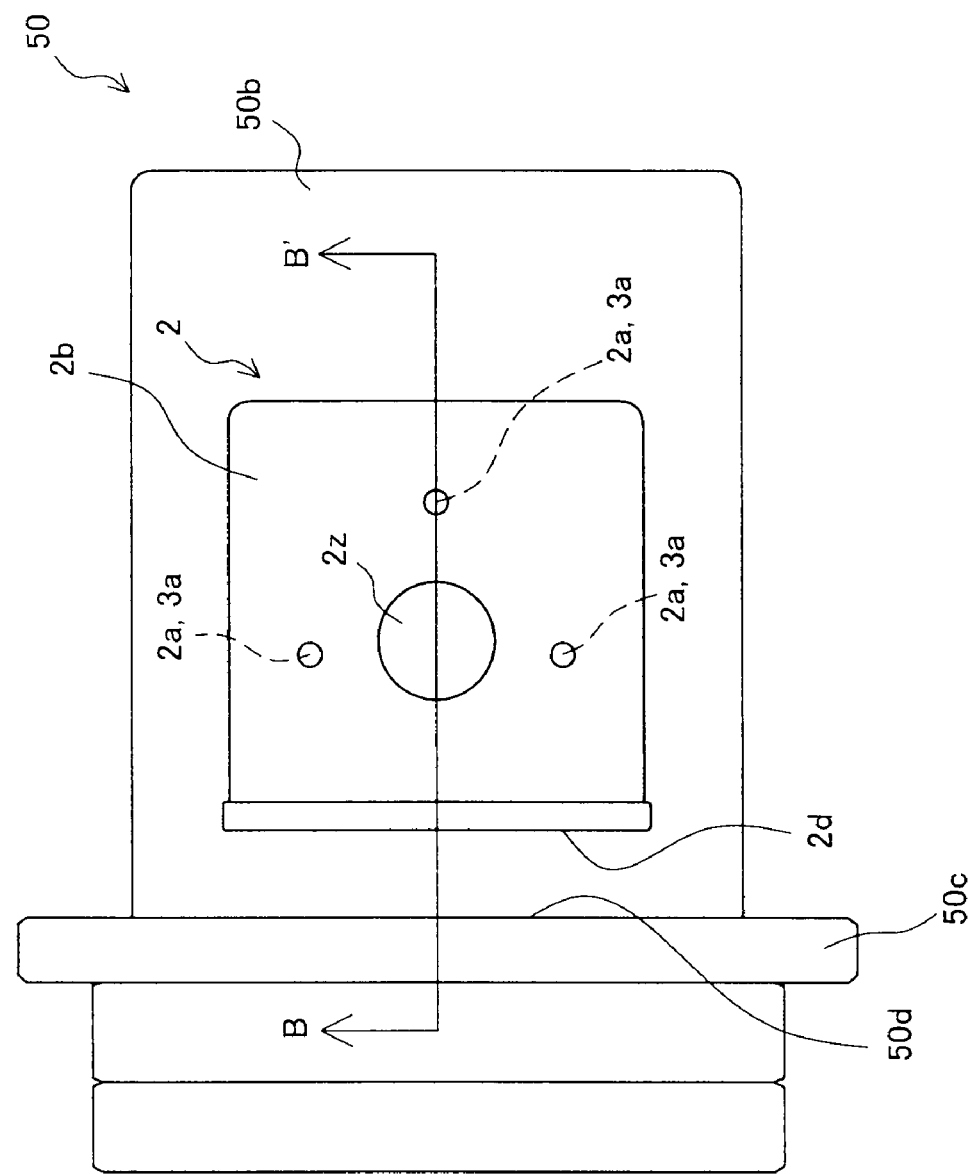
FIG. 2 is an upper-face schematic diagram indicated by arrow A-A' in FIG. 1.

First, a description will be made for a whole constitution of a FOUP opener including a clamping mechanism of one embodiment of the present invention by referring to FIG. 1 and FIG. 2. FIG. 1 and FIG. 2 are side-face schematic diagrams of the FOUP opener of one embodiment of the present invention. FIG. 2 is an upper-face schematic diagram indicated by arrow A-A' in FIG. 1.

(FOUP Opener)

A FOUP opener 50 of the present embodiment is such as that shown in FIG. 1, and an interface mechanism communicatively connecting the interior of the FOUP (Front Open Unified Pod) 2 with the interior of a semiconductor manufacturing device (substrate processing device), in which the FOUP 2 is fixed to the FOUP opener 50. Furthermore, the FOUP opener 50 is installed in a clean room.

In the FOUP opener 50, a mounting base 51 is installed on a FOUP opener main body 50b, and a FOUP 2, which can accommodate a plurality of wafers 9, is fixed and installed on the mounting base 51. In this instance, the FOUP 2 is fixed to the mounting base 51 due to actions of a clamping mechanism 1. Furthermore, the FOUP opener 50 includes a wall portion 50c installed on the semiconductor manufacturing device side, a communication port 50h communicatively connected with the semiconductor manufacturing device is formed on the wall portion 50c, and a port door 50d is installed so as to shield the communication port 50h. The mounting base 51 is movably installed on the FOUP opener main body 50b in a direction at which the FOUP 2 is docked to the port door 50d (docking direction) and a reverse direction thereof (undocking direction), with the FOUP 2 being installed. In this instance, the mounting base 51 is constituted so as to include a carrier base to be described later (a first mounting base) and a clamping base to be described later (a second mounting base). Furthermore, the clamping mechanism 1 of the present embodiment is constituted, as described later, so as to include the mounting base 51. Then, the FOUP opener 50 docks the FOUP 2 to the port door 50d, thereafter, the port door 50d and a lid portion 2d (to be described later) of the FOUP 2 are released, by which the interior of the FOUP 2 and the interior of the semiconductor manufacturing device are kept air tight and communicatively connected with each other. In addition, the FOUP may accommodate one wafer.

(FOUP)

Figure 5:
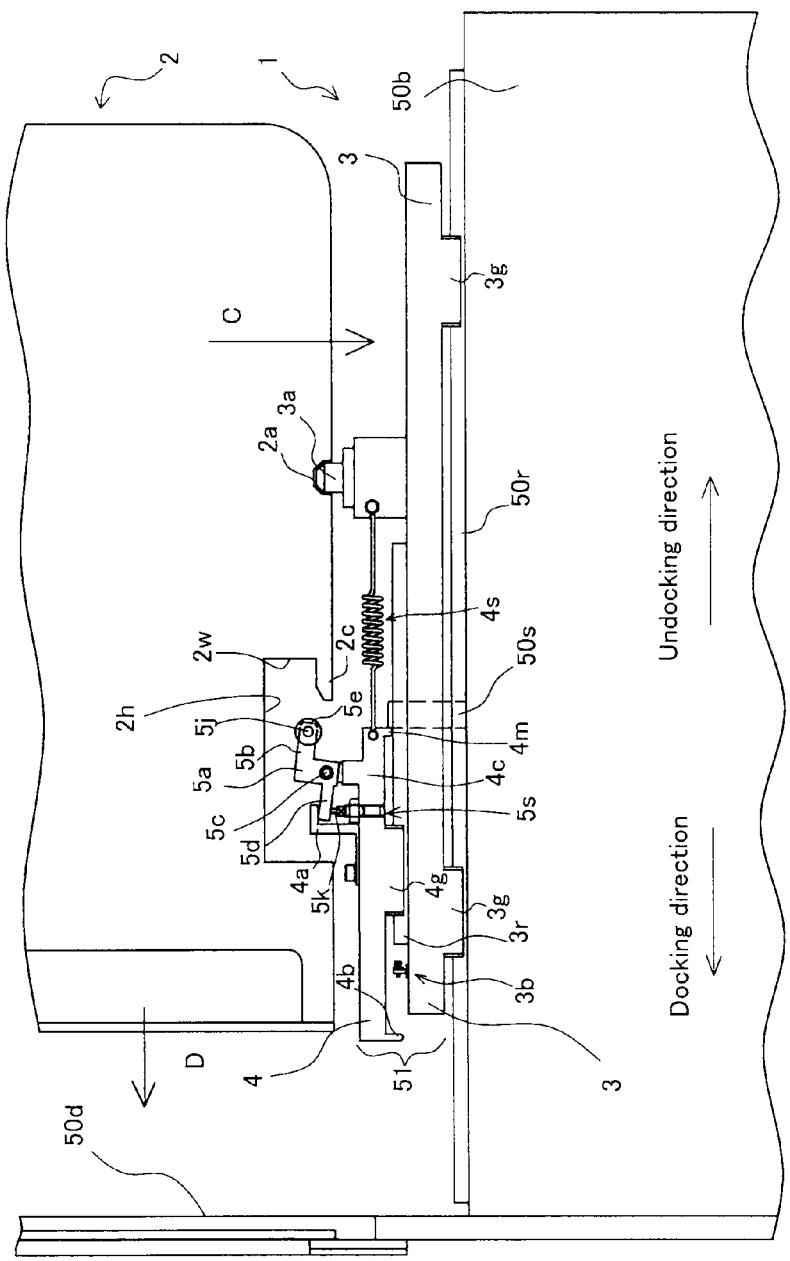
FIG. 5 is a cross-sectional schematic diagram at the position of B-B' in FIG. 2, showing a state that the FOUP is set on a carrier base.

Next, a description will be made for a constitution of the FOUP 2 by referring to FIG. 1 and FIG. 2. The FOUP 2 accommodates, conveys and stores a wafer 9 for an electronic device and is constituted so as to include a cabinet 2b and a lid portion 2d, which can be opened and closed on the cabinet 2b. In this instance, the FOUP 2 is applicable for conveying and storing various substrates. In a state that the lid portion 2d is attached to the cabinet 2b, prevented are the infiltration of foreign fine particles into the FOUP 2 and chemical contamination inside the FOUP 2. Furthermore, at the top of the cabinet 2b, installed is a grip portion 2z gripped by a conveyance robot or the like for conveying the FOUP 2. Still furthermore, as shown in FIG. 2, a positioning recess 2a to be described later is formed at three places on the bottom of the FOUP 2. In addition, FIG. 2 is an upper-face diagram in which the positioning recess 2a should be at a hidden and invisible position due to its location on the bottom of the FOUP 2. Additionally, it is illustrated in FIG. 2 for description. In addition, as shown by the dashed line in FIG. 1, a clamping recess 2h is installed on the bottom of the FOUP 2. Also as shown in FIG. 5, which is a cross-section schematic diagram at the position of B-B' in FIG. 2 (oblique lines showing the cross section is omitted), the FOUP 2 is provided with a clamped portion 2c formed so as to project to the docking direction from the inner wall face 2w of the clamping recess 2h in the undocking direction side (refer to arrow in the drawing).

(Clamping Mechanism)

Figure 3:
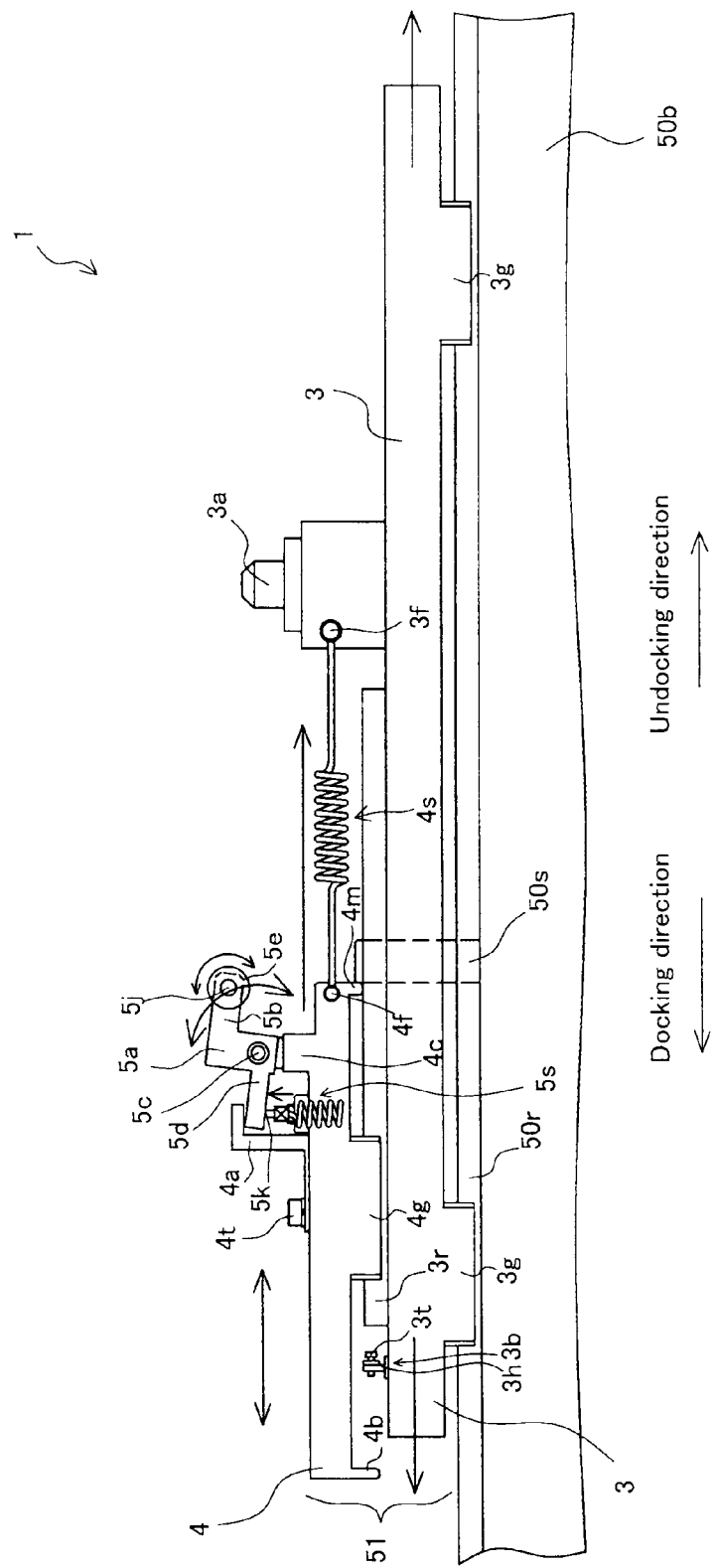
FIG. 3 is an enlarged cross-sectional schematic diagram at the position of B-B' in FIG. 2.

Next, a description will be made for the clamping mechanism 1 by referring to FIG. 3. FIG. 3 shows an enlarged cross-sectional schematic diagram (oblique lines showing the cross section is omitted) at the position of B-B' in FIG. 2. Furthermore, the FOUP 2 is omitted in FIG. 3. In this instance, the clamping mechanism 1 includes a mounting base 51, and the mounting base 51 is constituted so as to include a carrier space (a first mounting base) 3 and a clamping base (a second mounting base) 4. Hereinafter, a detailed description will be made for the respective constitutions.

(Carrier Base)

The carrier base 3 is a member formed in a plate shape, and a linear motion guide 3g is integrally formed at the bottom thereof. Furthermore, a rail 50r is installed along the docking direction and the undocking direction at the upper part of a FOUP opener main body 50b. Then, the linear motion guide 3g is mated with the rail 50r, by which the linear motion guide 3g moves along the rail 50r. As described above, the carrier base 3 is movably installed at the upper part of the FOUP opener main body 50b in the docking direction and the undocking direction. In addition, the linear motion guide may be formed as a member separate from the carrier base and attached to the carrier base.

Furthermore, a positioning projection 3a is formed at the upper part of the carrier base 3. Then, as shown in FIG. 5, where the FOUP 2 is set on the carrier base 3, the positioning projection 3a is fitted into a positioning recess 2a of the FOUP 2. Still furthermore, although only one of the positioning recesses 2a is shown in FIG. 3, as shown in FIG. 2, three positioning projections 3a are formed at the upper part of the carrier base 3 corresponding in position to three positioning recesses 2a of the FOUP 2. In FIG. 2, which is in itself an upper face diagram, the positioning projection 3a is to be in an invisible position hidden behind the FOUP 2, but illustrated in FIG. 2 for description. Then, the positioning projection 3a is fitted into the positioning recess 2a, by which the carrier base 3 and FOUP 2 are in a state that they integrally move. In other words, when the carrier base 3 moves on the rail 50r, the FOUP 2 also integrally moves with the carrier base 3.

Still furthermore, a rail 3r along the docking direction and the undocking direction is installed at the upper part of the carrier base 3, with the carrier base 3 installed on the rail 50r.

(Clamping Base)

Next, a description will be made for a clamping base 4 by referring to FIG. 3. The clamping base 4 is also a member formed in a plate shape, and a linear motion guide 4g is integrally installed on the bottom. Then, the linear motion guide 4g and the rail 3r are mated to each other, by which the linear motion guide 4g moves along the rail 3r. As described above, the clamping base 4 is movably installed at the upper part of the carrier base 3 in the docking direction and the undocking direction. Furthermore, the linear motion guide 4g and the rail 3r are used, by which the clamping base 4 can be movably installed at the upper part of the carrier base 3 in the docking direction and the undocking direction in a simple constitution. In addition, the linear motion guide may be formed as a member separate from a clamping base and attached to the clamping base.

Furthermore, a clamp lever 5a is rotatably supported at the upper part of the clamping base 4. Specifically, a supporting portion 4c is formed at the upper part of the clamping base 4, and the clamp lever 5a is rotatably supported by the rotating shaft 5c attached to the supporting portion 4c. In this instance, a rotating shaft 5c of the clamp lever 5a extends in a horizontal direction and is also orthogonal to the docking direction and the undocking direction. In other words, the rotating shaft 5c extends in a direction perpendicular to the space in FIG. 3, and the clamp lever 5a is allowed to rotate in a clockwise direction and also in a counter clockwise direction shown in FIG. 3. Furthermore, a clamping pawl 5b projecting to the undocking direction is formed on the clamp lever 5a. Still furthermore, a projection 5d projecting to the docking direction is also formed on the clamp lever 5a. Then, a coil spring 5s is installed as a second member at a position held between the projection 5d and the clamping base 4. As shown in FIG. 3, the coil spring 5s is embedded and installed at the upper part of the clamping base 4 in a state that an axial direction is in agreement with a vertical direction and also in a contracted state. Furthermore, the coil spring 5s is constituted so as to include a coil spring and a shaft-like pressing portion 5k installed at the end thereof. The coil spring 5s is constituted so as to provide a force pressing from below to above to the pressing portion 5k projected above by using an elastic force in a direction at which a spring is elongated. Then, the coil spring 5s constantly presses the projection 5d from below to above, by which the clamp lever 5a is given a force rotating in a clockwise direction shown in FIG. 3. Then, as a result, the coil spring 5s is to act on the clamp lever 5a so as to displace the clamping pawl 5b downward. Furthermore, a regulating portion 4a is fixed to the clamping base 4 with a bolt 4t. The leading end of the regulating portion 4a is arranged above the projection 5d so that a certain displacement amount is given to the projection 5d in a vertical direction, thereby regulated is an upward displacement amount of the projection 5d, that is, a rotatable angle of the clamp lever 5a.

In this instance, an additional description will be made for a direction at which the clamping pawl 5b and the projection 5d project. The clamp lever 5a is rotatably installed. Therefore, in the present embodiment, the clamping pawl 5b and the projection 5d project are respectively formed so as to project in the undocking direction and the docking direction in a state that the FOUP 2 is clamped by the clamping pawl 5b (refer to FIG. 6 and FIG. 7). Furthermore, in the present embodiment, a rotatable angle of the clamp lever 5a, that is, a vertically rocking width of the clamping pawl 5b is determined by a position of the pressing portion 5k in a state that the coil spring 5s is contracted to the maximum extent and a position of the leading end of the regulating portion 4a, by which the width is not so great. As a result, both in a state that the FOUP 2 is clamped by the clamping mechanism 1 (FIG. 6 and FIG. 7) and in a state that the FOUP 2 is not clamped (FIG. 3 to FIG. 5), the clamping pawl 5b and the projection 5d are respectively formed so as to project from the clamp lever 5a substantially in the undocking direction and the docking direction. More specifically, in a state that the FOUP 2 is not clamped, as compared with a clamped state, the clamping pawl 5b is inclined to a direction at which it is displaced downward (in a clockwise direction shown in FIG. 3) (refer to FIG. 3 to FIG. 5).

Figure 4:
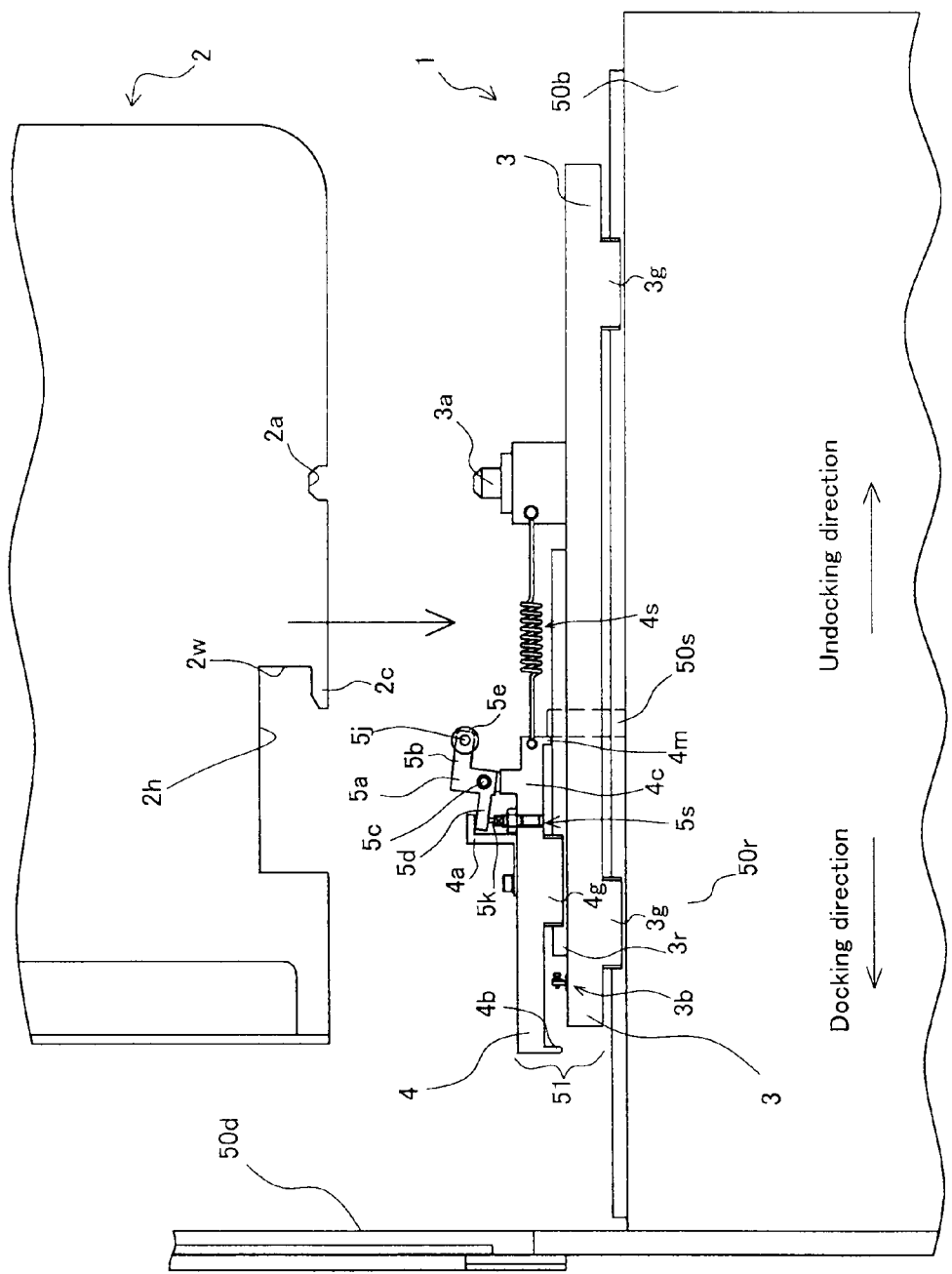
FIG. 4 is a cross-sectional schematic diagram at the position of B-B' in FIG. 2, showing a state that the FOUP is conveyed above the clamping mechanism.
Figure 6:
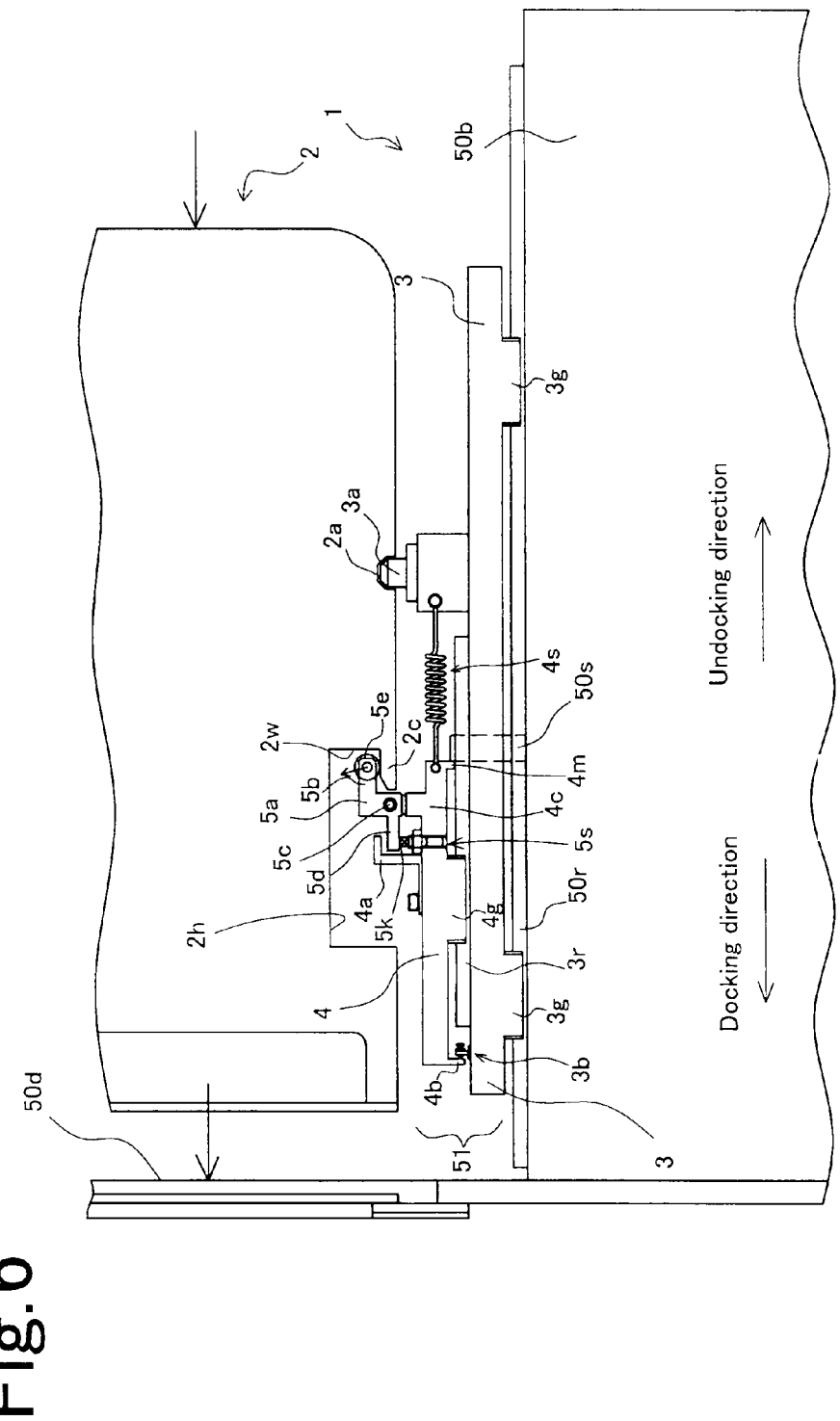
FIG. 6 is a cross-sectional schematic diagram at the position of B-B' in FIG. 2, showing a state that the FOUP is clamped by the clamping mechanism.
Figure 7:
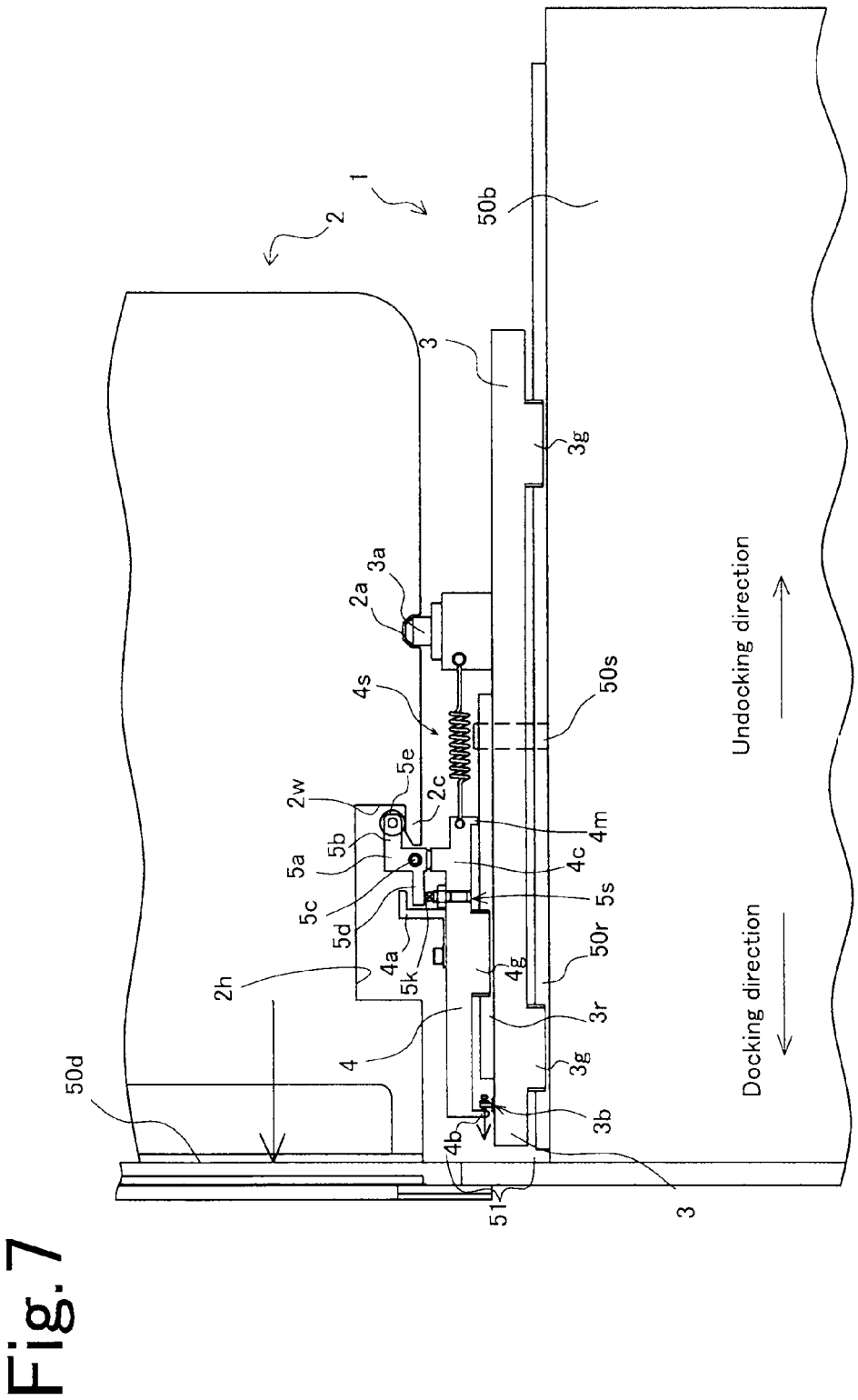
FIG. 7 is a cross-sectional schematic diagram at the position of B-B' in FIG. 2, showing a state that the FOUP is docked to a port door.

Furthermore, a second contact portion 4b is formed on the clamping base 4 so as to project downward, and a first contact portion 3b is installed on the carrier base 3. The first contact portion 3b includes a holder portion 3h fixed and installed on the carrier base 3 and a bolt 3t installed in a penetrating manner on the holder portion 3h along the docking direction and the undocking direction. Then, the bolt 3t is adjusted for a rotating extent, by which a projected height of the bolt 3t can be adjusted. The second contact portion 4b is also arranged further in the docking direction side than the first contact portion 3b. Then, on movement of the carrier base 3 and the FOUP 2 in the docking direction, the first contact portion 3b presses the second contact portion 4b, thereby the carrier base 3, the FOUP 2 and the clamping base 4 integrally move. In this instance, as shown in FIG. 3 to FIG. 5, in a state that the FOUP 2 is not clamped by the clamping mechanism 1, the second contact portion 4b and the first contact portion 3b are arranged so as not to be in contact with each other. As shown in FIG. 6 and FIG. 7, in a state that the FOUP 2 is clamped by the clamping mechanism 1, the second contact portion 4b is brought into contact with the first contact portion 3b. Furthermore, a positional relationship of the clamping base 4 with the carrier base 3 when the second contact portion 4b is in contact with the first contact portion 3b can be adjusted by adjusting a rotating extent of the bolt 3t.

Furthermore, at the leading end of the clamping pawl 5b, a roller 5e is rotatably supported via a rotating shaft 5j extending in a direction parallel to the rotating shaft 5c. Therefore, the roller 5e is able to rotate in a clockwise direction and also in a counterclockwise direction shown in FIG. 3.

Still furthermore, a connecting portion 4f and a connecting portion 3f are respectively installed on the clamping base 4 and the carrier base 3, and the connecting portion 4f and the connecting portion 3f are connected with each other via a coil spring 4s as a first member. In other words, the clamping base 4 and the carrier base 3 are connected with each other via the coil spring 4s. In an initial state before the FOUP 2 is clamped, the coil spring 4s is set in a state of being elongated, that is, in a state of undergoing an elastic force in a contracting direction. Therefore, the coil spring 4s acts in such a manner that the clamping base 4 is moved to the undocking direction with respect to the carrier base 3 (specifically, when observed on the basis of the carrier base 3).

In addition, a stopper 50s is fixed at the upper part of the FOUP opener main body 50b, and a stopper contact portion 4m, which is in contact with the stopper 50s, is formed on the clamping base 4. Although the details will be described later, the stopper 50s is to prevent the clamping base 4 from moving in the undocking direction. Thereby, even if the clamping base 4 is given such a force that allows the carrier base 3 to move in the undocking direction due to actions of the coil spring 4s, the stopper contact portion 4m is brought into contact with the stopper 50s at the position of the stopper 50s. As a result, the clamping base 4 cannot move further in the undocking direction from the position of the stopper 50s.

In this instance, the stopper 50s is installed so as not to be in contact with the carrier base 3. Therefore, a part of the stopper 50s, which is shown by the dashed line in FIG. 3, is formed in a roundabout manner so that it is not in contact with the carrier base 3 but in contact with the stopper contact portion 4m of the clamping base 4. Furthermore, the stopper is not limited to the above-described manner and may be installed so as to pass through a through groove installed on a carrier base. Still furthermore, a positional relationship of the stopper with the clamping base 4 is not limited to the above description and may include a case where the stopper is extended not from below but from laterally or above. A contact position of the clamping base 4 with the stopper may not necessarily include a case where the clamping base 4 is in contact with the stopper in the undocking direction side of the clamping base 4.

Furthermore, the stopper 50s is directly fixed to the FOUP opener main body 50b, which is given only as one example. The stopper 50s may only be fixed and installed on an unmovable object with respect to a base portion (a base portion on which the FOUP opener main body 50b is installed) (for example, the carrier base 3, the clamping base 4 moves to the base portion on which the FOUP opener main body 50b is installed), or may be fixed at other positions.

(Clamping Operation)

Next, a description will be made for clamping operation of the thus constituted clamping mechanism 1 by referring to FIG. 4 to FIG. 7. FIG. 4 to FIG. 7 are cross-sectional schematic diagrams of the position B to B' in FIG. 2 and show the operational procedures. Furthermore, the oblique lines showing the cross section is omitted in FIG. 4 to FIG. 7.

In an initial state before the FOUP 2 is clamped, the coil spring 4s is kept elongated, and the coil spring 5s is kept contracted. Furthermore, the clamping pawl 5b is inclined to a direction at which it is displaced downward (as compared with a state that the FOUP 2 is clamped).

First, a grip portion 2z of the FOUP 2 is gripped by a conveying robot (not illustrated), by which the FOUP 2 is conveyed above the clamping mechanism 1 of the FOUP opener 50. Then, the conveying robot is operated to lower the FOUP 2 toward the clamping mechanism 1 (refer to FIG. 4).

Then, the FOUP 2 is further lowered to fit a positioning projection 3a of the carrier base 3 into a positioning recess 2a on the bottom of the FOUP 2 (refer to FIG. 5 (arrow C)). Thereby, the FOUP 2 is set on the carrier base 3, and thereafter, the carrier base 3 and the FOUP 2 are to integrally move. In this instance, as described above, the clamping base 4 is given such a force by the coil spring 4s that allows the carrier base 3 to move in the undocking direction. However, since the stopper 50s is installed, the clamping base 4 is not allowed to move in the undocking direction further from the position of the stopper 50s. Therefore, when the FOUP 2 is lowered from above and set on the carrier base 3, a clamping pawl 5b can be arranged at a position where the clamping pawl 5b is not in contact with a clamped portion 2c and the clamping pawl 5b can be accommodated into a clamping recess 2h. As a result, on setting the FOUP 2, the clamping pawl 5b is reliably accommodated into the clamping recess 2h.

Next, a conveying robot is operated to move the FOUP 2 and the carrier base 3 in the docking direction (refer to FIG. 5 (arrow D)). In this instance, the clamping base 4 is given a force to move in the undocking direction to the carrier base 3 by actions of the coil spring 4s, but the clamping base 4 is restricted from movement in the undocking direction by the stopper 50s fixed and installed on the FOUP opener main body 50b. Therefore, the clamping base 4 is kept stationary at a position where the stopper 50s is in contact with the stopper contact portion 4m, while only the FOUP 2 and the carrier base 3 move in the docking direction. In this instance, the coil spring 4s is contracted due to the elasticity. Furthermore, in this instance, the coil spring 4s as an elastic member is adopted, by which a first member is made simple in constitution.

As described above, in an initial state of the clamping operation, the clamping pawl 5b is inclined to a direction at which it is displaced downward, as compared with a state of projecting in the undocking direction (on the clamping operation). Furthermore, an upward displacement amount of the projection 5d is restricted by a regulating portion 4a. In this instance, in order to reliably clamp the FOUP 2 by using the clamping pawl 5b, a greater clamping force is desired, and a greater rotation angle of the clamping pawl 5b is also desired (in other words, a greater downward displacement of the clamping pawl 5b is desired). However, when a clamping force is increased in a state that the clamping pawl 5b is large in rotatable angle, the clamping pawl 5b is in a state of being greatly displaced downward in an initial state. Therefore, in view of the contact angle on clamping operation, it is difficult that the clamping pawl 5b is made to ride over a clamped portion 2c.

Then, the regulating portion 4a is provided to prevent the clamp lever 5a from being inclined, thereby the clamping pawl 5b can ride over the clamped portion 2c even where a clamping force is increased. In addition, the clamping pawl 5b in an initial state can be adjusted for the inclination by switching the regulating portion 4a to another regulating portion different in height or inserting a separately provided spacer between the regulating portion 4a and the clamping base 4. Furthermore, when the FOUP 2 moves in the docking direction and the clamping pawl 5b rides over the clamped portion 2c, the clamping pawl 5b is smoothly in contact with the clamped portion 2c due to actions of the roller 5e. Thereby, the clamping pawl 5b is able to ride over the clamped portion 2c more easily, and an easy clamping operation can be provided. Furthermore, in this instance, the coil spring 5s as an elastic member is adopted, by which a second member is made simple in constitution.

Then, after the clamping pawl 5b rides over the clamped portion 2c, the FOUP 2 and the carrier base 3 move further in the docking direction, with the clamping base 4 kept unchanged in position. In other words, the clamping base 4 moves to the carrier base 3 in the undocking direction. Then, the clamping pawl 5b presses the clamped portion 2c from above to below, by which the FOUP 2 is fixed to the mounting base 51 (the carrier base 3 and the clamping base 4) (refer to FIG. 6). Furthermore, at this point of time (refer to FIG. 6), a first contact portion 3b is kept in contact with a second contact portion 4b.

As described above, since the FOUP 2 can be clamped without installing an actuator such as an air cylinder or a motor at a space 50u below a mounting base 51 (a carrier base and a clamping base), the space 50u below the mounting base 51 is not occupied (refer to FIG. 1). Thereby, the space 50u below the mounting base 51 can be effectively used, and an inner space 50i of the FOUP opener main body 50b can be effectively used in its entirety. As a result, the clamping mechanism 1 is also applicable, for example, to the technology described in Patent Document (3).

Furthermore, a simple mechanism is adopted in which the clamping pawl 5b rotated by an elastic member is used to press a clamped portion 2c without using a complicated actuator such as an air cylinder or a motor, thereby provided is a clamping mechanism lower in manufacture and maintenance costs.

Next, a conveying robot is operated, by which the FOUP 2 moves further in the docking direction to arrive at a docking position at which the FOUP 2 is docked to a port door 50d (refer to FIG. 7). In this instance, a first contact portion 3b presses a second contact portion 4b. Therefore, the FOUP 2 moves in the docking direction. In association with this movement, the carrier base 3 also moves in the docking direction, and the clamping base 4 also moves in the docking direction, together with the carrier base 3. As a result, the carrier base 3, the FOUP 2 and the clamping base 4 integrally move. According to the above constitution, when the carrier base 3, the FOUP 2 and the clamping base 4 integrally move, the first contact portion 3b presses the second contact portion 4b, by which there is provided a stable movement of the clamping base 4. In this instance, "stable movement" means that, for example, the clamping base 4 moves more stably than in a case where the clamping base 4 moves in the docking direction by the clamped portion 2c pressing the clamp lever 5a. Therefore, alleviated are loads applied to a clamp lever 5a on movement of the clamping base 4.

As described above, the FOUP 2 is completely docked, and the port door 50d and a lid portion 2d of the FOUP 2 (to be described later) are thereafter released, by which the interior of the FOUP 2 and the interior of a semiconductor manufacturing device are kept airtight and communicatively connected with each other. Then, a wafer (substrate) 9 inside the FOUP 2 is taken out by a substrate conveying robot (not illustrated) and conveyed to a predetermined position inside the semiconductor manufacturing device.

As described above, in the clamping mechanism 1, the FOUP 2 is clamped during docking operation. Therefore, provided is a clamping mechanism shorter in cycle time than a case where the clamping operation and docking operation are separately conducted.

(Exemplified Variation)

Figure 8:
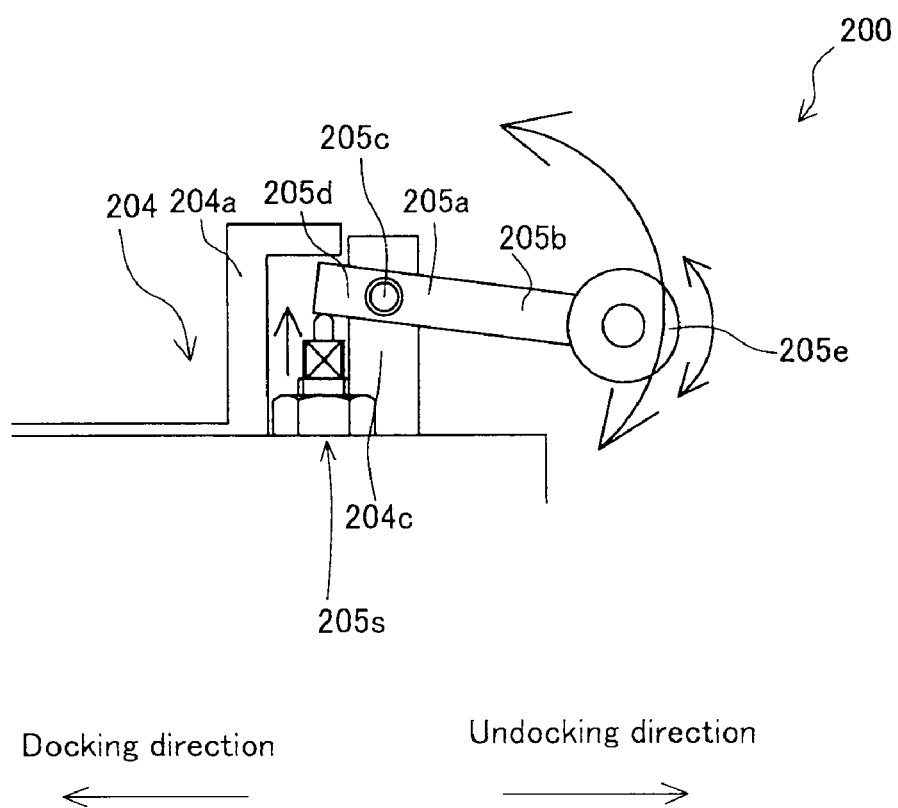
FIG. 8 is an enlarged cross-sectional schematic diagram showing Exemplified Variation 1 of the clamping mechanism.
Figure 9:
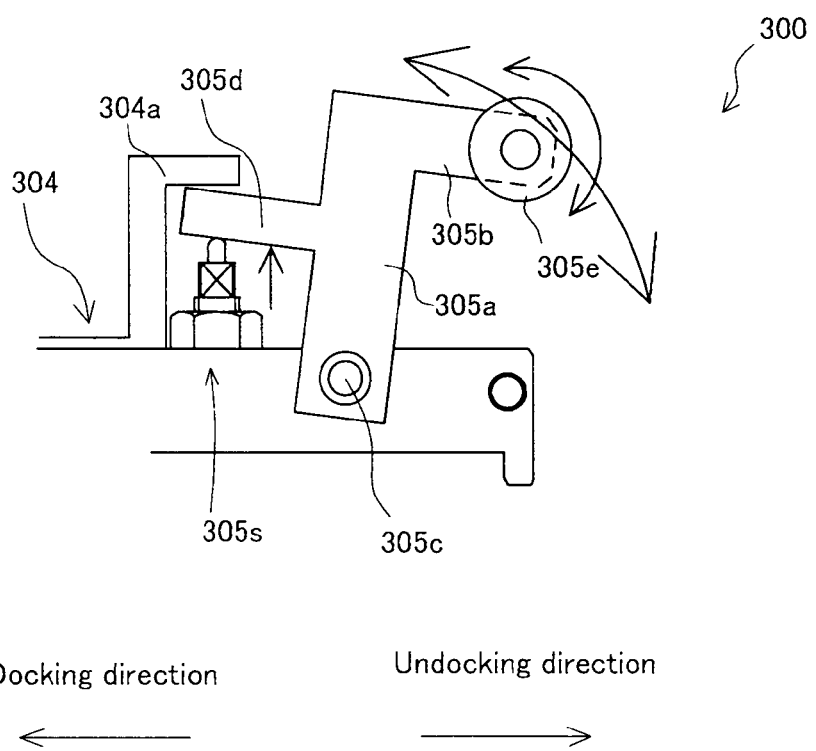
FIG. 9 is an enlarged cross-sectional schematic diagram showing Exemplified Variation 2 of the clamping mechanism.

Next, a description will be made for exemplified variations of the clamping mechanism in the present invention by referring to FIG. 8 and FIG. 9, with emphasis given to parts different from those of the above embodiment. FIG. 8 and FIG. 9 are enlarged cross-sectional schematic diagrams respectively showing Exemplified Variation 1 and Exemplified Variation 2. In addition, parts having reference numerals 200, 204, 204a, 204c, 205a, 205b, 205c, 205d, 205e, 205s, 300, 304, 304a, 305a, 305b, 305c, 305d, 305e and 305s respectively correspond to those having reference numerals 1, 4, 4a, 4c, 5a, 5b, 5c, 5d, 5e, 5s, 1, 4, 4a, 5a, 5b, 5c, 5d, 5e and 5s in the above embodiment.

First, in a clamping mechanism 200 of Exemplified Variation 1, a clamp lever is different in structure from that of the above embodiment, as shown in FIG. 8. A clamp lever 205a of the present exemplified variation is different from that of the above embodiment and linearly constituted. Then, the clamp lever 205a is rotatably supported by a rotating shaft 205c attached at a supporting portion 204c. The thus constituted clamping mechanism 200 also provides the effects which are the same as those of the above embodiment.

Furthermore, in a clamping mechanism 300 of Exemplified Variation 2, the clamp lever is different in structure from that of the above embodiment, as shown in FIG. 9. A clamp lever 305a of the present exemplified variation is different from that of the above embodiment and supported not by supporting portions (4c, 204c) installed on an upper clamping base but at the upper part of the main body on a clamping base 304. Then, similarly, the clamp lever 305a is rotatably supported by the rotating shaft 305c. The thus constituted clamping mechanism 300 also provides the effects which are the same as those of the above embodiment.

A description has been made for embodiments of the present invention. However, the present invention shall not be limited thereto but may be executed in various.

For example, in the above embodiment, an elastic member has been used as a first member and a second member. However, since the first member may only have functions to give a linear movement to a second mounting base and the second member may only have functions to give a rotating force to a clamp lever, they are not limited to an elastic member. For example, the first member and the second member may be an electronically controlled mechanism (a motor or the like), an air cylinder or a hydraulic cylinder. Furthermore, a coil spring has been used as an elastic member in the above embodiment. However, the elastic member means a member, which is flexible and highly elastic, and shall not be limited to a coil spring. Therefore, it may include, for example, a resin spring and rubber.

While this invention has been described in conjunction with the specific embodiments outlined above, it is evident that many alternatives, modifications and variations will be apparent to those skilled in the art. Accordingly, the preferred embodiments of the present invention as set forth above are intended to be illustrative, not limiting. Various changes may be made without departing from the spirit and scope of the present invention as defined in the following claims.

What is claimed is:

1. A clamping mechanism for fixing a FOUP to a mounting base used in a FOUP opener wherein the FOUP capable of accommodating wafers is fixed to the mounting base, the FOUP fixed to the mounting base is docked to a port door, which opens and closes a communication port leading into a substrate processing device, thereby the interior of the FOUP and the interior of the substrate processing device are kept airtight and communicatively connected with each other, the clamping mechanism, comprising:

a plate-like first mounting base movably installed at the upper part of a FOUP opener main body both in a docking direction at which the docking is conducted and in an undocking direction which is reverse to the docking direction;

a plate-like second mounting base movably installed at the upper part of the first mounting base both in the docking direction and the undocking direction;

a clamp lever rotatably supported by a rotating shaft extending in a horizontal direction and orthogonal to the docking direction and the undocking direction at the upper part of the second mounting base;

a first member acting so as to move the second mounting base to the undocking direction with respect to the first mounting base; and a second member;

wherein a clamping pawl projecting in the undocking direction is formed on the clamp lever, the second member acts on the clamp lever in such a manner as to displace the clamping pawl downward, a positioning recess is formed on the bottom of the FOUP, a positioning projection fitted into the positioning recess is formed on the first mounting base, the positioning projection is fitted into the positioning recess, by which the first mounting base and the FOUP are in such a state that they can integrally move, to fix the FOUP to the mounting base, the clamping pawl is accommodated into a clamping recess formed on the bottom of the FOUP, the second mounting base moves in the undocking direction with respect to the first mounting base, and the clamping pawl presses from above to below a clamped portion formed in a projected manner from an inner wall face of the clamping recess in the undocking direction side to the docking direction.

2. The clamping mechanism according to claim 1, wherein the first member is an elastic member connecting the second mounting base with the first mounting base.

3. The clamping mechanism according to claim 1, further comprising a stopper fixed to the FOUP opener main body and also preventing the second mounting base from moving in the undocking direction.

4. The clamping mechanism according to claim 1, further comprising:

a first contact portion installed on the first mounting base; and a second contact portion installed on the second mounting base and arranged in the docking direction side with respect to the first contact portion;

wherein when the first mounting base and the FOUP move in the docking direction, the first contact portion presses the second contact portion, thereby the first mounting base, the FOUP and the second mounting base integrally move.

5. The clamping mechanism according to claim 1, wherein the second member is an elastic member installed at the upper part of the second mounting base, a projection projecting in the docking direction is formed on the clamp lever, and the second member is held between the projection and the second mounting base, and presses the projection from below to above.

6. The clamping mechanism according to claim 5, wherein a regulating portion for regulating an upward displacement amount of the projection is formed on the second mounting base.

7. The clamping mechanism according to claim 1, further comprising;
    a roller rotatably supported by a rotating shaft extending in a horizontal direction and also orthogonal to the docking direction and the undocking direction,
   wherein the roller is installed at the leading end of the clamping pawl.

8. The clamping mechanism according to claim 1, wherein the second mounting base is connected with the first mounting base via a linear motion guide arranged along the docking direction and the undocking direction.

* * * * *